United States Patent
Cui et al.

(10) Patent No.: US 7,180,369 B1
(45) Date of Patent: Feb. 20, 2007

(54) BASEBAND FILTER START-UP CIRCUIT

(75) Inventors: Donghong Cui, San Jose, CA (US); Yonghua Song, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 96 days.

(21) Appl. No.: 10/759,173

(22) Filed: Jan. 20, 2004

Related U.S. Application Data

(60) Provisional application No. 60/470,618, filed on May 15, 2003.

(51) Int. Cl.
*H03F 3/45* (2006.01)

(52) U.S. Cl. .................. 330/252; 330/250; 330/260; 330/261

(58) Field of Classification Search ............... 330/253, 330/260, 255, 265, 271, 51, 250, 251
See application file for complete search history.

(56) References Cited

U.S. PATENT DOCUMENTS

| | | | |
|---|---|---|---|
| 5,512,859 A * | 4/1996 | Moraveji | 330/267 |
| 5,663,673 A * | 9/1997 | Tanaka et al. | 327/412 |
| 5,736,894 A * | 4/1998 | Suwa | 327/538 |
| 6,028,479 A | 2/2000 | Babanezhad | |
| 6,107,868 A * | 8/2000 | Diniz et al. | 327/543 |
| 6,404,252 B1 | 6/2002 | Wilsch | |
| 6,417,737 B1 * | 7/2002 | Moloudi et al. | 330/301 |
| 6,462,618 B2 * | 10/2002 | Minegishi | 330/252 |
| 6,529,076 B2 * | 3/2003 | Escobar-Bowser | 330/252 |
| 6,556,081 B2 * | 4/2003 | Muza | 330/253 |
| 6,570,448 B1 * | 5/2003 | Sobel | 330/254 |
| 6,710,654 B2 * | 3/2004 | Parkhurst et al. | 330/252 |
| 6,791,424 B2 * | 9/2004 | Uchiyama et al. | 331/116 FE |
| 2001/0031639 A1 | 10/2001 | Makipaa | |

\* cited by examiner

*Primary Examiner*—Linh Nguyen

(57) ABSTRACT

An electrical circuit includes an amplifier. The amplifier includes an input circuit in communication with an input of the amplifier. The amplifier includes a start-up circuit in communication with the input circuit. The start-up circuit is configured to generate a start-up signal to enable subsequent operation of the amplifier. Generation of the start-up signal by the start-up circuit can be ceased when the operation of the amplifier reaches a steady-state. The amplifier also includes an output circuit in communication with an output of the amplifier and in communication with the input circuit and the start-up circuit.

24 Claims, 6 Drawing Sheets

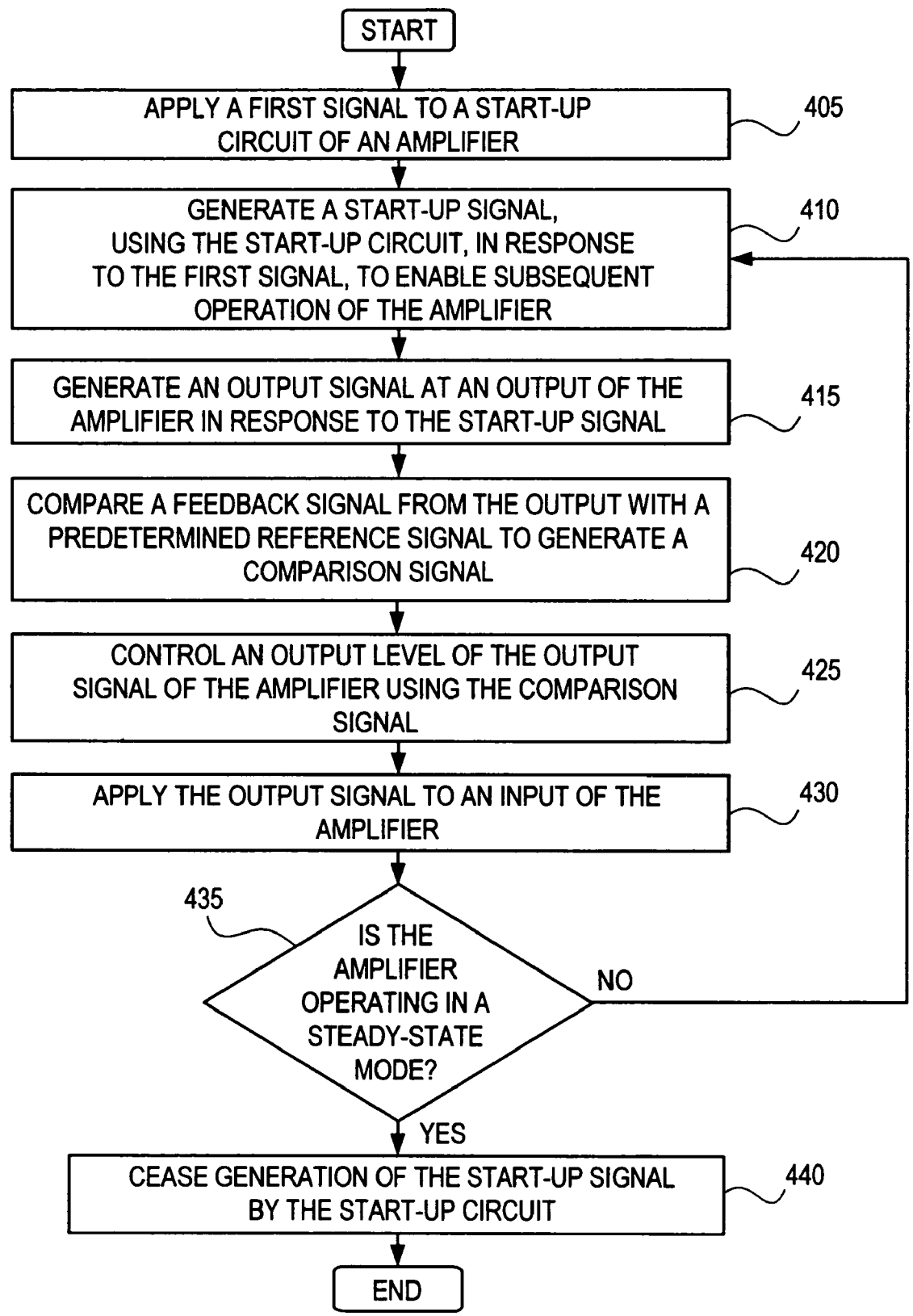

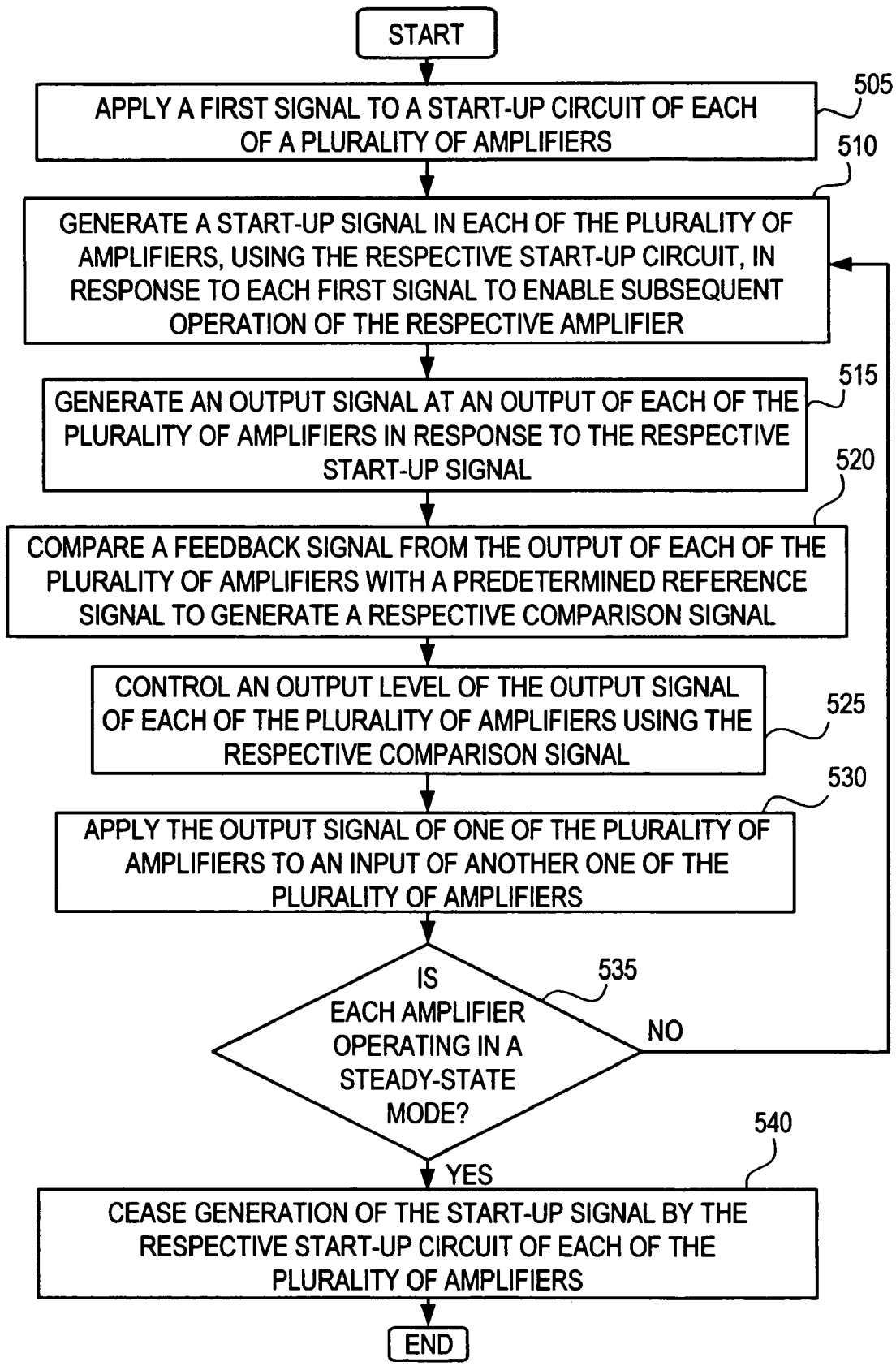

BASEBAND FILTER START-UP CIRCUIT

This application claims priority under 35 U.S.C. § 119(e) to U.S. Provisional Application No. 60/470,618, filed on May 15, 2003, the entire content of which is hereby incorporated herein by reference.

BACKGROUND

1. Field of the Invention

The present invention relates to electrical circuits. More particularly, the present invention relates to a baseband filter start-up circuit.

2. Background Information

Electrical circuits can have various operating modes, such as, for example, a power-down mode, where no current is flowing in the circuit, and a steady-state operating mode, where the circuit is conducting the calculated current(s). Start-up circuits have been used in many of such circuits to push the operation of the electrical circuit from the power-down mode into the steady-state operation. The start-up circuit injects an initial current into the electrical circuit, and once steady-state operation of the electrical circuit has been obtained (i.e., the circuit is conducting the calculated current (s)), the start-up circuit is turned off.

In, for example, a wireless transceiver, one or more components of the transceiver may not start-up themselves during initial power-up. For example, the components may be in a power-down state. Inputs to these components may be initially pulled down to ground so that no current passes through the components, as it is not desirable to consume power while the transceiver is in a power-down state. However, these transceiver components may have an unpredictable state (e.g., either high or low) at the beginning of operation when powering up, which can have an affect on obtaining subsequent steady-state operation of these components and the transceiver. Therefore, to have a predictable state when powering up, it is desirable to assist the start-up of such components.

SUMMARY OF THE INVENTION

A baseband filter start-up circuit and a method for starting up an electrical circuit are disclosed. In accordance with exemplary embodiments, according to a first aspect of the present invention, an electrical circuit includes an amplifier. The amplifier includes an input circuit in communication with an input of the amplifier. The amplifier includes a start-up circuit in communication with the input circuit. The start-up circuit is configured to generate a start-up signal to enable subsequent operation of the amplifier. The start-up circuit ceases generation of the start-up signal when the operation of the amplifier reaches a steady-state. The amplifier also includes an output circuit in communication with an output of the amplifier and in communication with the input circuit and the start-up circuit. According to an exemplary embodiment, the amplifier comprises a differential amplifier, the input of the amplifier comprises a differential input, and the output of the amplifier comprises a differential output.

According to the first aspect, the input circuit can include a first input transistor and a second input transistor. Base electrodes of the first and second input transistors can be in communication with the input. Emitter electrodes of the first and second input transistors can be in communication with each other and a first current source. The start-up circuit can include a first start-up transistor and a second start-up transistor. Base electrodes of the first and second start-up transistors can be in communication with a bias input. Emitter electrodes of the first and second start-up transistors can be in communication with each other and with the first current source. Collector electrodes of the first and second start-up transistors can be in communication with collector electrodes of the first and second input transistors, respectively. The output circuit can include a first output transistor, a second output transistor, a first impedance circuit, and a second impedance circuit. According to an exemplary embodiment of the first aspect, each of the first and second impedance circuits can include a capacitor and a resistor in series. Base electrodes of the first and second output transistors can be in communication with the first and second impedance circuits, respectively, and the collector electrodes of the first and second input transistors, respectively. Emitter electrodes of the first and second output transistors can be in communication with each other and with the first current source. Collector electrodes of the first and second output transistors can be in communication with the first and second impedance circuits, respectively, and the output.

According to the first aspect, the amplifier can also include a common-mode feedback circuit in communication with the output and second and third current sources. The second and third current sources can be in communication with the input and start-up circuits. The common-mode feedback circuit can include a comparator for comparing a feedback signal from the output with a predetermined reference signal to generate a comparison signal. The comparison signal can control the second and third current sources to control an output level of the amplifier. The common-mode feedback circuit can also include first and second resistors in communication with the output and an input of the comparator. The amplifier can include fourth and fifth current sources in communication with the input and start-up circuits, and sixth and seventh current sources in communication with the output and the output circuit.

According to the first aspect, the amplifier can be a fully differential operational amplifier, a Gm cell, or the like. The electrical circuit can be compliant with a standard selected from the group consisting of 802.11, 802.11a, 802.11b, 802.11g and 802.11i.

According to a second aspect of the present invention, an electrical circuit includes an amplifier means. The amplifier means includes an input circuit means for receiving an input signal. The input circuit means is in communication with an input means of the amplifier means. The amplifier means includes a start-up circuit means for generating a start-up signal to enable subsequent operation of the amplifier means. The start-up circuit means ceases generation of the start-up signal when the operation of the amplifier means reaches a steady-state. The start-up circuit means is in communication with the input circuit means. The amplifier means includes an output circuit means for outputting an output signal. The output circuit means is in communication with an output means of the amplifier means and in communication with the input circuit means and the start-up circuit means. According to an exemplary embodiment, the amplifier means comprises a differential amplifier means, the input means of the amplifier means comprises a differential input means, and the output means of the amplifier means comprises a differential output means.

According to the second aspect, the input circuit means can include first and second input amplifier means. Each of the first and second input amplifier means includes first, second and third electrode means. The first electrode means of the first and second input amplifier means can be in communication with the input means. The second electrode means of the first and second input amplifier means can be in communication with each other and a first current source means. The start-up circuit means can include first and second start-up amplifier means. Each of the first and second start-up amplifier means includes first, second and third electrode means. The first electrode means of the first and second start-up amplifier means can be in communication with a bias input means. The second electrode means of the first and second start-up amplifier means can be in communication with each other and with the first current source means. The third electrode means of the first and second start-up amplifier means can be in communication with third electrode means of the first and second input amplifier means, respectively. The output circuit means can include first and second output amplifier means and first and second impedance means. Each of the first and second output amplifier means includes first, second and third electrode means. The first electrode means of the first and second output amplifier means can be in communication with the first and second impedance means, respectively, and the third electrode means of the first and second input amplifier means, respectively. The second electrode means of the first and second output amplifier means can be in communication with each other and with the first current source means. The third electrode means of the first and second output amplifier means can be in communication with the first and second impedance means, respectively, and the output means.

According to the second aspect, the amplifier means can include feedback means in communication with the output means and second and third current source means. The second and third current source means can be in communication with the input and start-up circuit means. The feedback means can include means for comparing a feedback signal from the output means with a predetermined reference signal to generate a comparison signal. The comparison signal can control the second and third current source means to control an output level of the amplifier means. The feedback means can include first and second resistive means in communication with the output means and an input of the comparator means.

According to the second aspect, the amplifier means can include fourth and fifth current source means in communication with the input and start-up circuit means, and sixth and seventh current source means in communication with the output means and the output circuit means. The electrical circuit can be compliant with a standard selected from the group consisting of 802.11, 802.11a, 802.11b and 802.11g.

According to a third aspect of the present invention, a method of starting up an electrical circuit comprises the steps of: i.) applying a first signal to a start-up circuit of an amplifier; ii.) generating a start-up signal, using the start-up circuit, in response to the first signal to enable subsequent operation of the amplifier; iii.) generating an output signal at an output of the amplifier in response to the start-up signal; iv.) comparing a feedback signal from the output with a predetermined reference signal to generate a comparison signal; v.) controlling an output level of the output signal of the amplifier using the comparison signal; vi.) applying the output signal to an input of the amplifier; vii.) operating the amplifier in a steady-state mode; and viii.) ceasing generation of the start-up signal by the start-up circuit when the operation of the amplifier reaches the steady-state mode. According to an exemplary embodiment of the third aspect, the amplifier can comprise a differential amplifier, the input of the amplifier can comprise a differential input, and the output of the amplifier can comprise a differential output.

The method can be compliant with a standard selected from the group consisting of 802.11, 802.11a, 802.11b, 802.11g and 802.11i.

According to a fourth aspect of the present invention, an electrical circuit includes a plurality of amplifiers. Each of the plurality of amplifiers includes an input circuit in communication with an input of the amplifier. Each of the plurality of amplifiers includes a start-up circuit in communication with the input circuit. The start-up circuit is configured to generate a start-up signal to enable subsequent operation of the amplifier. The start-up circuit of each of the plurality of amplifiers ceases generation of the respective start-up signal when the operation of the respective amplifier reaches a steady-state. Each of the plurality of amplifiers includes an output circuit in communication with an output of the amplifier and in communication with the input circuit and the start-up circuit. Respective inputs of a first and a second amplifier of the plurality of amplifiers can be in communication with outputs of a third amplifier of the plurality of amplifiers. Outputs of the second amplifier can be in communication with inputs of the third amplifier. According to an exemplary embodiment, each of the plurality of amplifiers comprises a differential amplifiers, the input of each of the plurality of amplifiers comprises a differential input, and the output of each of the plurality of amplifiers comprises a differential output.

According to the fourth aspect, the input circuit of each of the plurality of amplifiers can include a first input transistor and a second input transistor. Base electrodes of the first and second input transistors can be in communication with the input. Emitter electrodes of the first and second input transistors can be in communication with each other and a first current source. The start-up circuit of each of the plurality of amplifiers can include a first start-up transistor and a second start-up transistor. Base electrodes of the first and second start-up transistors can be in communication with a bias input. Emitter electrodes of the first and second start-up transistors can be in communication with each other and with the first current source. Collector electrodes of the first and second start-up transistors can be in communication with collector electrodes of the first and second input transistors, respectively. The output circuit of each of the plurality of amplifiers can include a first output transistor, a second output transistor, a first impedance circuit, and a second impedance circuit. According to an exemplary embodiment, each of the first and second impedance circuits can include a capacitor and a resistor in series. Base electrodes of the first and second output transistors can be in communication with the first and second impedance circuits, respectively, and the collector electrodes of the first and second input transistors, respectively. Emitter electrodes of the first and second output transistors can be in communication with each other and with the first current source. Collector electrodes of the first and second output transistors can be in communication with the first and second impedance circuits, respectively, and the output.

According to the fourth aspect, each of the plurality of amplifiers can include a common-mode feedback circuit in communication with the output and second and third current sources. The second and third current sources can be in communication with the input and start-up circuits. The common-mode feedback circuit of each of the plurality of amplifiers can include a comparator for comparing a feedback signal from the output with a predetermined reference signal to generate a comparison signal. The comparison signal can control the second and third current sources to control an output level of the amplifier. The common-mode feedback circuit of each of the plurality of amplifiers can include first and second resistors in communication with the output and an input of the comparator. Each of the plurality of amplifiers can further include fourth and fifth current sources in communication with the input and start-up circuits, and sixth and seventh current sources in communication with the output and the output circuit.

According to an exemplary embodiment of the fourth aspect, outputs of the first amplifier can be in communication with inputs of the third amplifier. A first impedance circuit can be in communication between an input and an output of each of the first and second amplifiers, and a second impedance circuit can be in communication between an input and an output of the third amplifier. According to an exemplary embodiment, the first impedance circuit can include a resistor and a capacitor in parallel, and the second impedance circuit can include a capacitor. According to an alternative exemplary embodiment, outputs of the first amplifier can be in communication with inputs of the first amplifier. An input of the first amplifier and an input and an output of the second amplifier can be in communication with an impedance circuit. The impedance circuit can include at least one capacitor in communication with a reference voltage. Inputs of the third amplifier can be in communication with outputs of the second amplifier and outputs of the third amplifier can be in communication with inputs of the first and second amplifiers. Each of the plurality of amplifiers can be a fully differential operational amplifier. Alternatively, each of the plurality of amplifiers can be a Gm cell. The electrical circuit can be compliant with a standard selected from the group consisting of 802.11, 802.11a, 802.11b, 802.1 µg and 802.11i.

According to a fifth aspect of the present invention, an electrical circuit includes a plurality of amplifier means. Each of the plurality of amplifier means includes an input circuit means for receiving an input signal. The input circuit means is in communication with an input means of the amplifier means. Each of the plurality of amplifier means includes a start-up circuit means for generating a start-up signal to enable subsequent operation of the amplifier means. The start-up circuit means is in communication with the input circuit means. The start-up circuit means of each of the plurality of amplifier means ceases generation of the respective start-up signal when the operation of the respective amplifier means reaches a steady-state. Each of the plurality of amplifier means includes an output circuit means for outputting an output signal. The output circuit means is in communication with an output means of the amplifier means and in communication with the input circuit means and the start-up circuit means. Respective input means of a first and a second amplifier means of the plurality of amplifier means can be in communication with output means of a third amplifier means of the plurality of amplifier means. Output means of the second amplifier means can be in communication with input means of the third amplifier means. According to an exemplary embodiment, each of the plurality of amplifier means comprises a differential amplifier means, the input means of each of the plurality of amplifier means comprises a differential input means, and the output means of each of the plurality of amplifier means comprises a differential output means.

According to the fifth aspect, the input circuit means of each of the plurality of amplifier means can include first and second input amplifier means. Each of the first and second input amplifier means includes first, second and third electrode means. The first electrode means of the first and second input amplifier means can be in communication with the input means. The second electrode means of the first and second input amplifier means can be in communication with each other and a first current source means. The start-up circuit of each of the plurality of amplifier means can include first and second start-up amplifier means. Each of the first and second start-up amplifier means includes first, second and third electrode means. The first electrode means of the first and second start-up amplifier means can be in communication with a bias input means. The second electrode means of the first and second start-up amplifier means can be in communication with each other and with the first current source means. The third electrode means of the first and second start-up amplifier means can be in communication with third electrode means of the first and second input amplifier means, respectively. The output circuit of each of the plurality of amplifier means can include first and second output amplifier means and first and second impedance means. Each of the first and second output amplifier means includes first, second and third electrode means. The first electrode means of the first and second output amplifier means can be in communication with the first and second impedance means, respectively, and the third electrode means of the first and second input amplifier means, respectively. The second electrode means of the first and second output amplifier means can be in communication with each other and with the first current source means. The third electrode means of the first and second output amplifier means can be in communication with the first and second impedance means, respectively, and the output means.

According to the fifth aspect, each of the plurality of amplifier means can include feedback means in communication with the output means and second and third current source means. The second and third current source means can be in communication with the input and start-up circuit means. The feedback means of each of the plurality of amplifier means can include means for comparing a feedback signal from the output means with a predetermined reference signal to generate a comparison signal. The comparison signal can control the second and third current source means to control an output level of the amplifier means. The feedback means of each of the plurality of amplifier means can include first and second resistive means in communication with the output means and an input of the comparator means. Each of the plurality of amplifier means can include fourth and fifth current source means in communication with the input and start-up circuit means, and sixth and seventh current source means in communication with the output means and the output circuit means.

According to an exemplary embodiment of the fifth aspect, output means of the first amplifier means can be in communication with input means of the third amplifier means. A first impedance means can be in communication between an input means and an output means of each of the first and second amplifier means. A second impedance means can be in communication between an input means and an output means of the third amplifier means. According to an alternative exemplary embodiment, output means of the first amplifier means can be in communication with input means of the first amplifier means. An input means of the first amplifier means and an input means and an output means of the second amplifier means can be in communication with an impedance means. Input means of the third amplifier means can be in communication with output means of the second amplifier means and output means of the third amplifier means can be in communication with input means of the first and second amplifier means. The electrical circuit can be compliant with a standard selected from the group consisting of 802.11, 802.11a, 802.11b, 802.11g and 802.11i.

According to a sixth aspect of the present invention, a method of starting up an electrical circuit comprises the steps of: i.) applying a first signal to a start-up circuit of each of a plurality of amplifiers; ii.) generating a start-up signal in each of the plurality of amplifiers, using the respective start-up circuit, in response to each first signal to enable subsequent operation of the respective amplifier; iii.) generating an output signal at an output of each of the plurality of amplifiers in response to the respective start-up signal; iv) comparing a feedback signal from the output of each of the plurality of amplifiers with a predetermined reference signal to generate a respective comparison signal; v.) controlling an output level of the output signal of each of the plurality of amplifiers using the respective comparison signal; vi.) applying the output signal of one of the plurality of amplifiers to an input of another one of the plurality of amplifiers; vii.) operating each of the plurality of amplifiers in a steady-state mode; and viii.) ceasing generation of the start-up signal by the respective start-up circuit of each of the plurality of amplifiers, when the operation of the respective amplifier reaches the steady-state mode. According to an exemplary embodiment of the sixth aspect, each of the plurality of amplifiers can comprise a differential amplifier, the input of each of the plurality of amplifiers can comprise a differential input, and the output of each of the plurality of amplifiers comprises a differential output. The method can be compliant with a standard selected from the group consisting of 802.11, 802.11a, 802.11b, 802.11g and 802.11i.

According to a seventh aspect of the present invention, an electrical circuit includes a differential amplifier. The differential amplifier includes an input circuit in communication with a differential input of the differential amplifier. The input circuit can include a first input transistor and a second input transistor. Base electrodes of the first and second input transistors are in communication with the differential input. Emitter electrodes of the first and second input transistors are in communication with each other and a first current source. The differential amplifier includes a start-up circuit in communication with the input circuit. The start-up circuit is configured to generate a start-up signal to enable subsequent operation of the differential amplifier. The start-up circuit ceases generation of the start-up signal when the operation of the differential amplifier reaches a steady-state. The start-up circuit can include a first start-up transistor and a second start-up transistor. Base electrodes of the first and second start-up transistors are in communication with a bias input. Emitter electrodes of the first and second start-up transistors are in communication with each other and with the first current source. Collector electrodes of the first and second start-up transistors are in communication with collector electrodes of the first and second input transistors, respectively.

According to the seventh aspect, the differential amplifier includes an output circuit in communication with the input circuit and the start-up circuit. The output circuit is in communication with a differential output of the differential amplifier. The output circuit can include a first output transistor, a second output transistor, a first impedance circuit, and a second impedance circuit. Base electrodes of the first and second output transistors are in communication with the first and second impedance circuits, respectively, and the collector electrodes of the first and second input transistors, respectively. Emitter electrodes of the first and second output transistors are in communication with each other and with the first current source. Collector electrodes of the first and second output transistors are in communication with the first and second impedance circuits, respectively, and the differential output. According to an exemplary embodiment, the first and second impedance circuits each can include a capacitor and a resistor in series. The differential amplifier can comprise a fully differential operational amplifier. Alternatively, the differential amplifier can comprise a Gm cell. The electrical circuit is compliant with a standard selected from the group consisting of 802.11, 802.11a, 802.11b, 802.11g and 802.11i.

According to the seventh aspect, the differential amplifier includes a common-mode feedback circuit in communication with the differential output and second and third current sources. The second and third current sources are in communication with the input and start-up circuits. The common-mode feedback circuit can include a comparator for comparing a feedback signal from the differential output with a predetermined reference signal to generate a comparison signal. The comparison signal controls the second and third current sources to control an output level of the differential amplifier. The common-mode feedback circuit can include first and second resistors in communication with the differential output and an input of the comparator. The differential amplifier can include fourth and fifth current sources in communication with the input and start-up circuits, and sixth and seventh current sources in communication with the differential output and the output circuit.

According to an eighth aspect of the present invention, an electrical circuit includes a differential amplifier means. The differential amplifier means includes an input circuit means for receiving a differential input signal. The input circuit means is in communication with a differential input means of the differential amplifier means. The input circuit means can include first and second input amplifier means. Each of the first and second input amplifier means includes first, second and third electrode means. The first electrode means of the first and second input amplifier means are in communication with the differential input means. The second electrode means of the first and second input amplifier means are in communication with each other and a first current source means. The differential amplifier means includes a start-up circuit means for generating a start-up signal to enable subsequent operation of the differential amplifier means. The start-up circuit means ceases generation of the start-up signal when the operation of the differential amplifier means reaches a steady-state. The start-up circuit means is in communication with the input circuit means. The start-up circuit can include first and second start-up amplifier means. Each of the first and second start-up amplifier means includes first, second and third electrode means. The first electrode means of the first and second start-up amplifier means are in communication with a bias input means. The second electrode means of the first and second start-up amplifier means are in communication with each other and with the first current source means. The third electrode means of the first and second start-up amplifier means are in communication with the third electrode means of the first and second input amplifier means, respectively.

According to the eighth aspect, the differential amplifier means includes an output circuit means for outputting a differential output signal. The output circuit means is in communication with a differential output means of the differential amplifier means and in communication with the input circuit means and the start-up circuit means. The output circuit can include first and second output amplifier means and first and second impedance means. Each of the first and second output amplifier means includes first, second and third electrode means. The first electrode means of the first and second output amplifier means are in communication with the first and second impedance means, respectively, and the third electrode means of the first and second input amplifier means, respectively. The second electrode means of the first and second output amplifier means are in communication with each other and with the first current source means. The third electrode means of the first and second output amplifier means are in communication with the first and second impedance means, respectively, and the differential output means. The electrical circuit is compliant with a standard selected from the group consisting of 802.11, 802.11a, 802.11b, 802.1 g and 802.11i.

According to the eighth aspect, the differential amplifier means includes feedback means in communication with the differential output means and second and third current source means. The second and third current source means are in communication with the input and start-up circuit means. The feedback means can include means for comparing a feedback signal from the differential output means with a predetermined reference signal to generate a comparison signal. The comparison signal controls the second and third current source means to control an output level of the differential amplifier means. The feedback means can include first and second resistive means in communication with the differential output means and an input of the comparator means. The differential amplifier means includes fourth and fifth current source means in communication with the input and start-up means, and sixth and seventh current source means in communication with the differential output means and the output circuit means.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIG. 4 is a flowchart illustrating steps for starting up an electrical circuit, in accordance with an exemplary embodiment of the present invention.

FIG. 5 is a flowchart illustrating steps for starting up an electrical circuit, in accordance with an alternative exemplary embodiment of the present invention.

DETAILED DESCRIPTION OF THE PREFERRED EMBODIMENTS

Figure 1A:
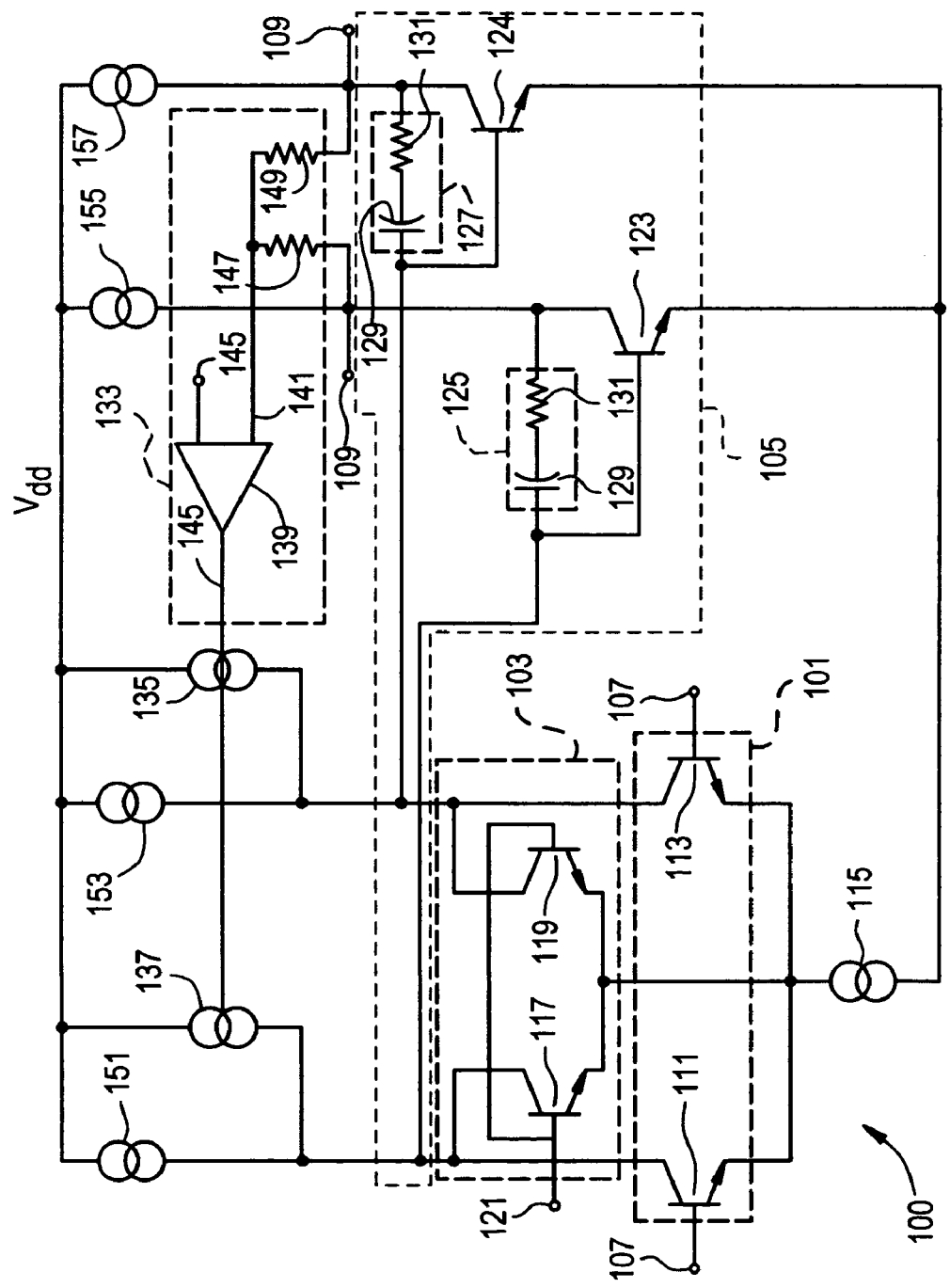
FIG. 1A is a circuit diagram illustrating an electrical circuit comprising an amplifier, in accordance with an exemplary embodiment of the present invention.

Exemplary embodiments of the present invention are directed to a baseband filter start-up circuit and a method for starting up an electrical circuit. According exemplary embodiments, an electrical circuit can include, for example, a differential amplifier. The differential amplifier can include an input circuit in communication with a differential input of the differential amplifier. The differential circuit can include a start-up circuit in communication with the input circuit. The start-up circuit is configured to generate a start-up signal to enable subsequent operation of the differential amplifier. The start-up circuit can cease generation of the start-up signal when the operation of the differential amplifier reaches a steady-state. The differential amplifier can also include an output circuit in communication with a differential output of the differential amplifier and in communication with the input circuit and the start-up circuit.

According to an exemplary embodiment, a baseband low-pass filter, such as, for example, an active RC filter, can employ a "leapfrog" structure comprised of a plurality of such differential amplifiers that have been interconnected. When an intermediate frequency (IF) signal is received, a mixer circuit can down-convert the incoming carrier signal to baseband, and the baseband signal can be passed to the baseband low-pass filter. Initially, however, the low-pass filter is in a power-down state, and each of the differential amplifiers can use its associated start-up circuit to push the differential amplifier into steady-state operation. Once each of the differential amplifiers reaches steady-state, the associated start-up circuit shuts down and the baseband low-pass filter continues operation.

For example, according to an exemplary embodiment, the common-mode voltage of each of the differential amplifiers can be set at approximately one-half $V_{dd}$, or approximately 1.5V. Each of the differential amplifiers can be two-stage operational amplifiers that can use, for example, bipolar transistors as the input devices, with, for example, current sources at the top and bottom of the circuit. The start-up circuit of each differential amplifier can be comprised of, for example, a pair of bipolar transistors biased at, for example, approximately 1.2V. Upon power up, the differential amplifiers' differential inputs still stay at low, and, consequently, no current flows through the input pair. The 1.2V bias signal forces the start-up circuit to start conducting current. Once the differential amplifiers begin conducting current, the differential amplifiers can include common-mode feedback circuits the can force the differential outputs of the differential amplifiers to the 1.5V reference voltage. Because of the leapfrog structure of the low-pass filter, the differential inputs of the other differential amplifiers can also settle to the same 1.5V reference voltage. As a result, the emitter voltage ($V_{be}$) of each of the start-up circuits becomes approximately one $V_{be}$ down from 1.5V, turning off the start-up circuits, while the baseband low-pass filter continues to operate in a steady-state mode.

These and other aspects of the present invention will now be described in greater detail. FIG. 1A is a circuit diagram illustrating an electrical circuit comprising an amplifier 100. In accordance with an exemplary embodiment of the present invention, the amplifier 100 can comprise, for example, a differential amplifier, a single-ended amplifier or the like. The amplifier 100 can include an input circuit 101 in communication with an input 107 of the amplifier 100. According to an exemplary embodiment, the input 107 can comprise, for example, a differential input of a differential amplifier. The amplifier 100 can include a start-up circuit 103 in communication with the input circuit 101. The start-up circuit 103 can be configured to generate a start-up signal to enable subsequent operation of the amplifier 100. The start-up circuit 103 can cease generation of the start-up signal when the operation of the amplifier 100 reaches a steady-state. The amplifier 100 can also include an output circuit 105 in communication with an output 109 of the amplifier 100 and in communication with the input circuit 101 and the start-up circuit 103. According to an exemplary embodiment, the output 109 can comprise, for example, a differential output of a differential amplifier.

According to an exemplary embodiment of the present invention, the input circuit 101 can include a first input transistor 111 and a second input transistor 113. The first and second input transistors 111, 113 can be, for example, bipolar transistors (e.g., NPN bipolar transistors) or any other suitable semiconductor device, such as field-effect transistors (FETs), metal-oxide semiconductor FETs (MOSFETs), or the like. The base electrodes of the first and second input transistors 111, 113 can be in communication with a respective input of the input 107. The emitter electrodes of the first and second input transistors 111, 113 can be in communication with each other and a first current source 115. The first current source 115 can be active (e.g., a transistor) or passive (e.g., an impedance element, such as any suitable combination of resistors, capacitors and inductors).

According to an exemplary embodiment of the present invention, the start-up circuit 103 can include a first start-up transistor 117 and a second start-up transistor 119. The first and second start-up transistors 117, 119 can be, for example, bipolar transistors (e.g., NPN bipolar transistors) or any other appropriate semiconductor device, such as FETs, MOSFETs, or the like. The base electrodes of the first and second start-up transistors 117, 119 can be in communication with a bias input 121. The emitter electrodes of the first and second start-up transistors 117, 119 can be in communication with each other and with the first current source 115. The collector electrodes of the first and second start-up transistors 117, 119 can be in communication with collector electrodes of the first and second input transistors 111, 113, respectively.

According to an exemplary embodiment of the present invention, the output circuit can include a first output transistor 123, a second output transistor 124, a first impedance circuit 125, and a second impedance circuit 127. Base electrodes of the first and second output transistors 123, 124 can be in communication with the first and second impedance circuits 125, 127, respectively, and with the collector electrodes of the first and second input transistors 111, 113, respectively. Emitter electrodes of the first and second output transistors 123, 124 can be in communication with each other and with the first current source 115. Collector electrodes of the first and second output transistors 123, 124 can be in communication with the first and second impedance circuits 125, 127, respectively, and a respective output of the output 109. According to an exemplary embodiment, each of the first and second impedance circuits 125, 127 can be comprised of a capacitor 129 and a resistor 131 in series. The capacitor 129 and resistor 131 can each have any appropriate value. However, the first and second impedance circuits 125, 127 can be comprised of any suitable combination of impedance elements, including capacitors, resistors, and inductors, in any appropriate arrangement. For example, first and second impedance circuits 125, 127 can be comprised of capacitor 129 only, or of capacitor 129 and a MOSFET resistor 131 in series, and like. Other suitable combinations of impedance elements are possible for first and second impedance circuits 125, 127.

The amplifier 100 can include a common-mode feedback circuit 133 in communication with the output 109 and second and third current sources 135, 137. The second and third current sources 135, 137 can be active (e.g., a transistor) or passive (e.g., an impedance element, such as any suitable combination of resistors, capacitors and inductors). The second and third current sources 135, 137 can be in communication with input circuit 101 and start-up circuit 103, such as, for example, in communication with the collector electrodes of the input and start-up circuits 101, 103. According to an exemplary embodiment of the present invention, the common-mode feedback circuit 133 can include a comparator 139 for comparing a feedback signal (e.g., on input 141) from the output 109 with a predetermined reference signal (e.g., on input 143) to generate a comparison signal (e.g., on output 145). The comparator 139 can be any suitable electrical or electronic component or device capable of comparing two signals and generating a signal (e.g., a voltage signal) that indicates which of the two signals is larger. The comparison signal can be used to control the second and third current sources 135, 137 to control an output level (e.g., the output DC current level) of the amplifier 100.

The common-mode feedback circuit 133 can also include first and second resistors 147, 149 in communication with the input 109 and the input 141 of the comparator 139. The first and second resistors 147, 149 can be of any appropriate value and can act as summing resistors for summing or otherwise combining the output signal on output 109 and feeding back the combined signal to input 141 of the comparator 139. According to exemplary embodiments, the DC power supply voltage $V_{dd}$ for the amplifier 100 can be set at, for example, approximately 3V, or any other appropriate value. The predetermined reference signal can be a voltage signal equal to approximately one-half of $V_{dd}$, such as, for example, approximately 1.5V or any other appropriate value. According to exemplary embodiments, the predetermined reference signal at input 143 of comparator 130 should be approximately 100 mV to 200 mV greater than the bias signal applied on bias input 121 to start-up circuit 103 to avoid moving the amplifier 100 into saturation. According to an exemplary embodiment, the bias signal can be approximately 1.2V, or any other appropriate value.

The amplifier 100 can include fourth and fifth current sources 151, 153 in communication with the input and start-up circuits 101, 103, and sixth and seventh current sources 155, 157 in communication with respective outputs of output 109 and with the output circuit 105. The fourth, fifth, sixth and seventh current sources 151, 153, 155, 157 can be active (e.g., a transistor) or passive (e.g., an impedance element, such as any suitable combination of resistors, capacitors and inductors).

Thus, according to an exemplary embodiment, the common-mode voltage of amplifier 100 can be set at, for example, approximately one-half $V_{dd}$, or approximately 1.5V. The bias signal applied to start-up circuit 103 can be set at, for example, 1.2V. Upon power up, the inputs 107 stay at low, and, consequently, no current flows through the input pair of input circuit 101. However, at power up, the 1.2V bias signal applied to the start-up circuit 103 forces the start-up circuit 103 to start conducting current, creating an output signal at output 109. From the output signal at output 109, a feedback signal can be applied to the comparator 139 of common-mode feedback circuit 133. The feedback signal can be compared to the 1.5V reference voltage. The resulting comparison signal can control second and third current sources 135, 137 to force the output 109 of output circuit 105 to 1.5V. Because of the leapfrog structure of the low-pass filter (to be discussed below), the inputs of other amplifiers can also settle to the same 1.5V reference voltage. Once the input settles to the 1.5V reference voltage, the emitter voltage ($V_{be}$) of the start-up circuit 103 becomes approximately one $V_{be}$ down from 1.5V, turning off the start-up circuit, while the amplifier 100 continues to operate in a steady-state mode. However, those of ordinary skill will recognize that other reference voltage values and bias signal levels can be used, depending on, for example, the choice of components used for amplifier 100 and the application of such components.

According to exemplary embodiments, the amplifier 100 can comprise a fully differential operational amplifier, a Gm (transconductor) cell, or any other suitable type of differential amplifier. Any or all of the components of amplifier 100 can be connected to one another using any suitable type of electrical connection capable of communicating electrical information. Alternatively or additionally, any or all components of amplifier 100 can be formed on, for example, a monolithic substrate. In addition, the amplifier 100 can be compliant with a standard selected from the group consisting of 802.11, 802.11a, 802.11b, 802.11g and 802.11i, or any other appropriate wired or wireless standard.

Figure 1B:
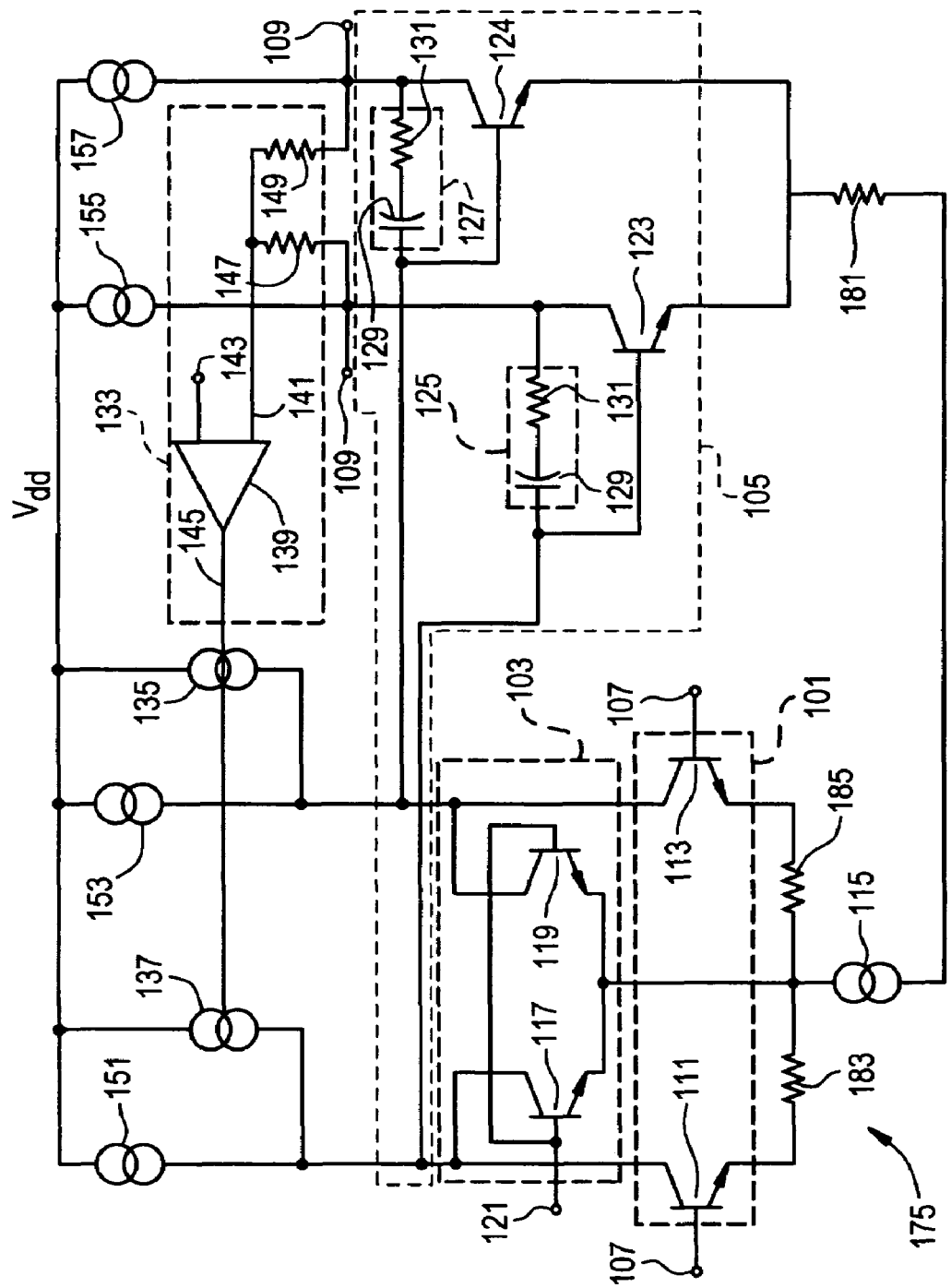
FIG. 1B is a circuit diagram illustrating an electrical circuit comprising an amplifier, in accordance with an alternative exemplary embodiment of the present invention.

Other alternative embodiments of the amplifier 100 are possible using the start-up circuit 103. For example, FIG. 1B is a circuit diagram illustrating an electrical circuit comprising an amplifier 175, in accordance with an alternative exemplary embodiment of the present invention. For amplifier 175, the first and second output transistors 123, 124 can have their emitters coupled and a first degeneration resistor 181 placed between the coupled emitters and a reference voltage (e.g., ground). Additionally, the first and second input transistors 111, 113 can also be resistor degenerated, using second and third degeneration resistors 183, 185. Other alternative exemplary embodiments are possible for the amplifier with start-up circuit according to the present invention.

Figure 2:
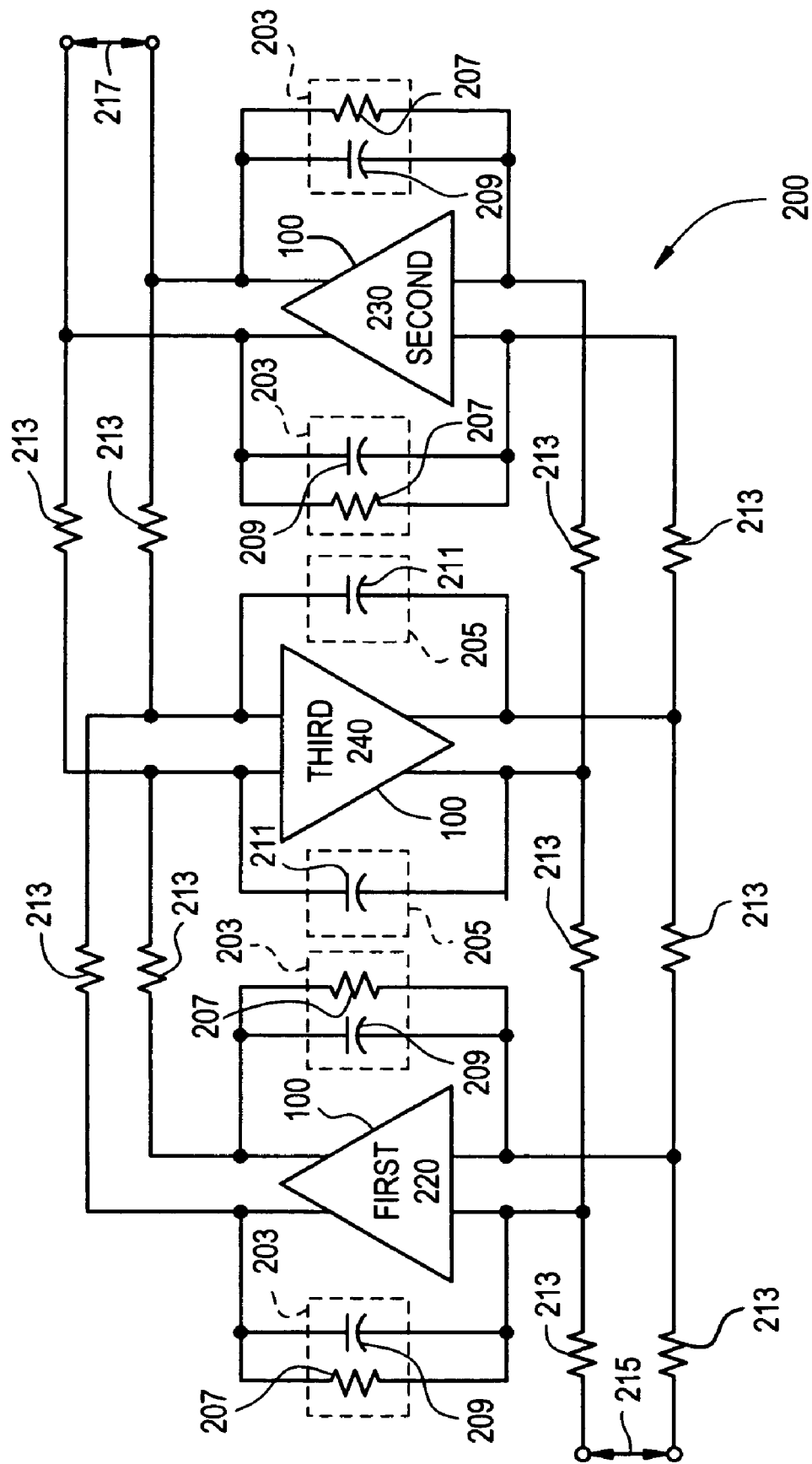
FIG. 2 is a circuit diagram illustrating an electrical circuit comprising a plurality of amplifiers, in accordance with an exemplary embodiment of the present invention.

According to an exemplary embodiment of the present invention as illustrated in FIG. 2, a plurality of amplifiers 100 can be interconnected to form, for example, a baseband low-pass filter 200 using a "leapfrog" structure. However, other alternative embodiments for interconnecting a plurality of amplifiers 100 are possible. For example, two or more amplifiers 100 can be interconnected using the "leapfrog" structure illustrated in FIG. 2 to form the baseband low-pass filter 200, a baseband band-pass filter, or the like. Other alternative exemplary embodiments are possible for interconnecting a plurality of amplifiers with start-up circuits according to the present invention.

In accordance with an exemplary embodiment of the present invention, FIG. 2 is a circuit diagram illustrating an electrical circuit comprising a plurality of amplifiers 100. According to an exemplary embodiment, the amplifiers 100 can comprise, for example, differential amplifiers, single-ended amplifiers or the like. Each of the plurality of amplifiers 100 can include an input circuit 101 in communication with an input 107 of the amplifier 100. According to an exemplary embodiment, each input 107 can comprise, for example, a differential input of a differential amplifier. Each of the plurality of amplifiers 100 can include a start-up circuit 103 in communication with the input circuit 101. The start-up circuit 103 can be configured to generate a start-up signal to enable subsequent operation of the amplifier 100. The start-up circuit 103 of each of the plurality of amplifiers 100 can cease generation of the respective start-up signal when the operation of the respective amplifier 100 reaches a steady-state.

Each of the plurality of amplifiers 100 can include an output circuit 105 in communication with an output 109 of the amplifier 100 and in communication with the input circuit 101 and the start-up circuit 103. According to an exemplary embodiment, each output 109 can comprise, for example, a differential output of a differential amplifier. For the leapfrog structure of FIG. 2, outputs of a first and a second amplifier 220, 230 of the plurality of amplifiers 100 can be in communication with respective inputs of a third amplifier 240 of the plurality of amplifiers 100. Outputs of the third amplifier 240 can be in communication with respective inputs of the first and second amplifiers 220, 230.

The input circuit 101 of each of the plurality of amplifiers 100 can include a first input transistor 111 and a second input transistor 113. Base electrodes of the first and second input transistors 111, 113 can be in communication with the input 107. Emitter electrodes of the first and second input transistors 111, 113 can be in communication with each other and a first current source 115.

The start-up circuit 103 of each of the plurality of amplifiers 100 can include a first start-up transistor 117 and a second start-up transistor 119. Base electrodes of the first and second start-up transistors 117, 119 can be in communication with a bias input 121. Emitter electrodes of the first and second start-up transistors 117, 119 can be in communication with each other and with the first current source 115. Collector electrodes of the first and second start-up transistors 117, 119 can be in communication with collector electrodes of the first and second input transistors 111, 113, respectively.

The output circuit 105 of each of the plurality of amplifiers 100 can include a first output transistor 123, a second output transistor 124, a first impedance circuit 125, and a second impedance circuit 127. According to an exemplary embodiment, each of the first and second impedance circuits 125, 127 can include, for example, a capacitor 129 and a resistor 131 in series, although the first and second impedance circuits 125, 127 can be comprised of any suitable combination of impedance elements (e.g., resistors, capacitors and inductors) in any appropriate arrangement. Base electrodes of the first and second output transistors 123, 124 can be in communication with the first and second impedance circuits 125, 127, respectively, and the collector electrodes of the first and second input transistors 111, 113, respectively. Emitter electrodes of the first and second output transistors 123, 124 can be in communication with each other and with the first current source 115. Collector electrodes of the first and second output transistors 123, 124 can be in communication with the first and second impedance circuits 125, 127, respectively, and the output 109.

Each of the plurality of amplifiers 100 can also include a common-mode feedback circuit 133 in communication with the output 109 and second and third current sources 135, 137. The second and third current sources 135, 137 can be in communication with the input and start-up circuits 101, 103. The common-mode feedback circuit 133 of each of the plurality of amplifiers 100 can include a comparator 139 for comparing a feedback signal from the output 109 with a predetermined reference signal to generate a comparison signal. The comparison signal can control the second and third current sources 135, 137 to control an output level of the amplifier 100. The common-mode feedback circuit 133 of each of the plurality of amplifiers 100 can also include first and second resistors 147, 149 in communication with the output 109 and an input 141 of the comparator 139.

Each of the plurality of amplifiers 100 can include fourth and fifth current sources 151, 153 in communication with the input and start-up circuits 101, 103, and sixth and seventh current sources 155, 157 in communication with the output 109 and the output circuit 105.

According to an exemplary embodiment, a first impedance circuit 203 can be in communication between an input and an output of each of the first and second amplifiers 220, 230. A second impedance circuit 205 can be in communication between an input and an output of the third amplifier 240. For example, the first impedance circuit 203 can include a resistor 207 and a capacitor 209 in parallel. The second impedance circuit 205 can include, for example, a capacitor 211. The resistor 207, the capacitor 209, and the capacitor 211 can each have any appropriate value. However, the first and second impedance circuits 203, 205 can be comprised of any appropriate combination of impedance elements, including capacitors, resistors, and inductors, in any suitable arrangement. The leapfrog structure illustrated in FIG. 2 can also include, for example, resistors 213, which can be of any appropriate value. According to an alternative exemplary embodiment, the resistors 213 can be replaced with, for example, MOSFETs or other suitable semiconductor devices to provide resistive elements.

The baseband low-pass filter 200 can receive an input signal on input 215 from, for example, a mixer circuit, and output an output signal on output 217 to, for example, a baseband gain circuit, such as, for example, as part of a transceiver or other suitable wireless or wired communication system. Those of ordinary skill will recognize that the baseband low-pass filter 200 can include or be used in combination with any additional components that can be used, for example, for receiving and transmitting information signals, including mixers, local oscillators, demodulators, modulators, automatic gain controls, phase locked loops, filters, power amplifiers, power supplies or any other suitable components in any combination that can be used for receiving and transmitting information signals, depending upon the nature and type of information signals to be communicated and the environment in which the baseband low-pass filter 200 is to be used. For example, the baseband low-pass filter 200 can be compliant with a standard selected from the group consisting of 802.11, 802.11a, 802.11b, 802.11g and 802.11i, or any other suitable wireless or wired standard.

Upon power up, the inputs of the amplifiers 100 stay at low. However, the 1.2V bias signal applied to the respective start-up circuits 103 forces the start-up circuits 103 to start conducting current. Once the amplifiers 100 start conducting currents, the common-mode feedback circuits 133 can force the outputs 109 of each of the amplifiers 100 to the 1.5V reference voltage. As a result of the leapfrog structure of baseband low-pass filter 200, as the outputs of each of the plurality of amplifiers 100 are forced to the reference voltage of 1.5V from the associated common-mode feedback circuits 133, the inputs of each of the plurality of amplifiers 100 also settle to the same reference voltage of 1.5V. Consequently, the emitter voltage ($V_{be}$) of the associated start-up circuit 103 can become approximately one $V_{be}$ down from 1.5V, turning off the associated start-up circuit 103, while each of the amplifiers 100 continues to operate in a steady-state mode. Those of ordinary skill will recognize that other reference voltage values and bias signal levels can be used, depending on the choice of components used for amplifiers 100 and the application to which those components are applied.

Figure 3:
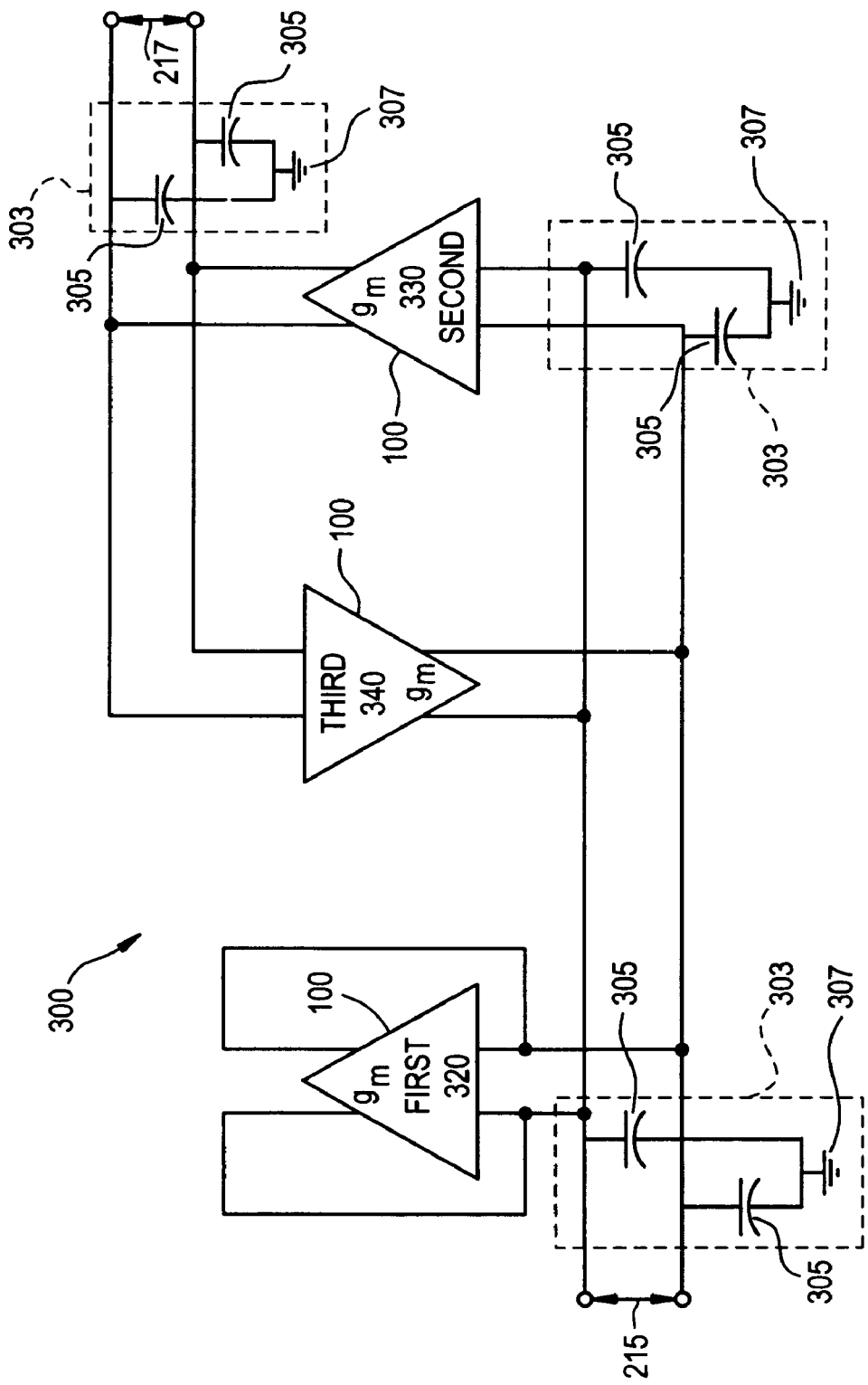
FIG. 3 is a circuit diagram illustrating an electrical circuit comprising a plurality of Gm cells, in accordance with an alternative exemplary embodiment of the present invention.

Each of the plurality of amplifiers 100 illustrated in FIG. 2 can be, for example, a fully differential operational amplifier. However, each of the plurality of amplifiers 100 can be, for example, a Gm cell. FIG. 3 is a circuit diagram illustrating an electrical circuit comprising a plurality of Gm cells 300, in accordance with an alternative exemplary embodiment of the present invention. According to the alternative exemplary embodiment, an input of a first amplifier 320 can be in communication with an impedance circuit 303, and an input and an output of a second amplifier 330 can be in communication with an impedance circuit 303. The outputs of the first amplifier 320 can be in communication with inputs of the first amplifier 320. The inputs of a third amplifier 340 can be in communication with the outputs of the second amplifier 330, and the outputs of the third amplifier 340 can be in communication with the inputs of the first and second amplifiers 320, 330. The impedance circuits 303 can include, for example, capacitors 305 in communication with a reference voltage 307 (e.g., a ground or any other appropriate reference voltage). The capacitors 305 can have any appropriate value. However, the impedance circuits 303 can be comprised of any suitable combination of impedance elements, including capacitors, resistors, and inductors, in any appropriate arrangement. In addition, other alternative embodiments for interconnecting a plurality of Gm cells 300 are possible. For example, two or more amplifiers 100 can be interconnected using the structure illustrated in FIG. 3 to form a baseband low-pass filter, a baseband band-pass filter, or the like.

FIG. 4 is a flowchart illustrating steps for starting up an electrical circuit, in accordance with an exemplary embodiment of the present invention. In step 405, a first signal can be applied to a start-up circuit of an amplifier. The first signal can be, for example, a bias signal. In step 410, a start-up signal can be generated, using the start-up circuit, in response to the first signal to enable subsequent operation of the amplifier. In step 415, an output signal can be generated at an output of the amplifier in response to the start-up signal. In step 420, a feedback signal from the output can be compared with a predetermined reference signal to generate a comparison signal. In step 425, an output level of the output signal of the amplifier can be controlled using the comparison signal. In step 430, the output signal can be applied to an input of the amplifier. In step 435, if the amplifier is not yet operating in a steady-state mode, then the process can continue at step 410 and continue to generate the start-up signal until the amplifier operates in the steady-state mode. However, if the amplifier is operating in the steady-state mode in step 435, then in step 440, the generation of the start-up signal by the start-up circuit can be ceased. According to an exemplary embodiment, the amplifier can comprise a differential amplifier, the input of the amplifier can comprise a differential input, and the output of the amplifier can comprise a differential output. The method can be compliant with a standard selected from the group consisting of 802.11, 802.11a, 802.11b, 802.11g and 802.11i, or any other suitable wireless or wired standard.

FIG. 5 is a flowchart illustrating steps for starting up an electrical circuit, in accordance with an alternative exemplary embodiment of the present invention. In step 505, a first signal can be applied to a start-up circuit of each of a plurality of amplifiers. The first signal can be, for example, a bias signal. In step 510, a start-up signal can be generated in each of the plurality of amplifiers, using the respective start-up circuit, in response to each first signal to enable subsequent operation of the respective amplifier. In step 515, an output signal can be generated at an output of each of the plurality of amplifiers in response to the respective start-up signal. In step 520, a feedback signal from the output of each of the plurality of amplifiers can be compared with a predetermined reference signal to generate a respective comparison signal. In step 525, an output level of the output signal of each of the plurality of amplifiers can be controlled using the respective comparison signal. In step 530, the output signal of one of the plurality of amplifiers can be applied to an input of another one of the plurality of amplifiers. In step 535, if each of the plurality of amplifiers is not yet operating in a steady-state mode, then the process can continue at step 510 and continue to generate the respective start-up signals until each of the plurality of amplifiers operates in the steady-state mode. However, if each of the plurality of amplifiers is operating in the steady-state mode in step 535, then in step 540, the generation of the start-up signal by the respective start-up circuit of each of the plurality of amplifiers can be ceased. According to an exemplary embodiment, each of the plurality of amplifiers can comprise a differential amplifier, the input of each of the plurality of amplifiers can comprise a differential input, and the output of each of the plurality of amplifiers can comprise a differential output. The method can be compliant with a standard selected from the group consisting of 802.11, 802.11a, 802.11b, 802.11g and 802.11i, or any other suitable wireless or wired standard.

Exemplary embodiments of the present invention can be used in, for example, any circuit, device or system that can use amplifiers, in particular, amplifiers that require start-up upon power-up of the circuit, device or system. For example, a combination of such amplifiers can be used as, for example, a baseband low-pass or band-pass filter in a transceiver or other communication device, including both wired and wireless communication devices and systems. For example, exemplary embodiments can be used in cellular telephone and other wireless communication devices.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. An electrical circuit, comprising:
    a differential amplifier, comprising:
    an input circuit in communication with a differential input of the differential amplifier, the input circuit comprising:
        a first input transistor; and a second input transistor, wherein base electrodes of the first and second input transistors are in communication with the differential input, and wherein emitter electrodes of the first and second input transistors are in communication with each other and a first current source;
    a start-up circuit in communication with the input circuit, wherein the start-up circuit is configured to generate a start-up signal to enable subsequent operation of the differential amplifier, the start-up circuit comprising:
        a first start-up transistor; and a second start-up transistor, wherein base electrodes of the first and second start-up transistors are in communication with a bias input, wherein emitter electrodes of the first and second startup transistors are in communication with each other and with the first current source, and wherein collector electrodes of the first and second start-up transistors are in communication with collector electrodes of the first and second input transistors, respectively; and an output circuit in communication with the input circuit and the start up circuit, wherein the output circuit is in communication with a differential output of the differential amplifier, the output circuit comprising:
    a first output transistor;
    a second output transistor;
    a first impedance circuit; and
    a second impedance circuit, wherein base electrodes of the first and second output transistors are in communication with the first and second impedance circuits, respectively, and the collector electrodes of the first and second input transistors, respectively, wherein emitter electrodes of the first and second output transistors are in communication with each other and with the first current source, and wherein collector electrodes of the first and second output transistors are in communication with the first and second impedance circuits, respectively, and the differential output.

2. The electrical circuit of claim 1, wherein the first and second impedance circuits each comprise a capacitor and a resistor in series.

3. The electrical circuit of claim 1, wherein the differential amplifier further comprises:
    a common-mode feedback circuit in communication with the differential output and second and third current sources, wherein the second and third current sources are in communication with the input and start-up circuits.

4. The electrical circuit of claim 3, wherein the common-mode feedback circuit comprises:
    a comparator for comparing a feedback signal from the differential output with a predetermined reference signal to generate a comparison signal, wherein the comparison signal controls the second and third current sources to control an output level of the differential amplifier; and
    first and second resistors in communication with the differential output and an input of the comparator.

5. The electrical circuit of claim 3, wherein the differential amplifier further comprises:
    fourth and fifth current sources in communication with the input and start-up circuits; and
    sixth and seventh current sources in communication with the differential output and the output circuit.

6. The electrical circuit of claim 1, wherein the start-up circuit ceases generation of the start-up signal when the operation of the differential amplifier reaches a steady-state.

7. The electrical circuit of claim 1, wherein the differential amplifier comprises a fully differential operational amplifier.

8. The electrical circuit of claim 1, wherein the differential amplifier comprises a Gm cell.

9. The electrical circuit of claim 1, wherein the electrical circuit is compliant with a standard selected from the group consisting of 802.11, 802.11a, 802.11b, 802.11g and 802.11i.

10. An electrical circuit, comprising:
    a differential amplifier means, comprising:
        an input circuit means for receiving a differential input signal, wherein the input circuit means is in communication with a differential input means of the differential amplifier means, and wherein the input circuit means comprises:

first and second input amplifier means, wherein each of the first and second input amplifier means includes first, second and third electrode means, wherein the first electrode means of the first and second input amplifier means are in communication with the differential input means, and wherein the second electrode means of the first and second input amplifier means are in communication with each other and a first current source means;

a start-up circuit means for generating a start-up signal to enable subsequent operation of the differential amplifier means, wherein the start-up circuit means is in communication with the input circuit means, and wherein the start-up circuit comprises:

first and second start-up amplifier means, wherein each of the first and second start-up amplifier means includes first, second and third electrode means, wherein the first electrode means of the first and second start-up amplifier means are in communication with a bias input means, wherein the second electrode means of the first and second start-up amplifier means are in communication with each other and with the first current source means, and wherein the third electrode means of the first and second start-up amplifier means are in communication with the third electrode means of the first and second input amplifier means, respectively; and an output circuit means for outputting a differential output signal, wherein the output circuit means is in communication with a differential output means of the differential amplifier means and in communication with the input circuit means and the start-up circuit means, and wherein the output circuit comprises:

first and second output amplifier means, wherein each of the first and second output amplifier means includes first, second and third electrode means; and first and second impedance means, wherein the first electrode means of the first and second output amplifier means are in communication with the first and second impedance means respectively and the third electrode means of the first and second input amplifier means, respectively, wherein the second electrode means of the first and second output amplifier means are in communication with each other and with the first current source means, and wherein the third electrode means of the first and second output amplifier means are in communication with the first and second impedance means, respectively, and the differential output means.

11. The electrical circuit of claim 10, wherein the differential amplifier means further comprises:

feedback means in communication with the differential output means and second and third current source means, wherein the second and third current source means are in communication with the input and start-up circuit means.

12. The electrical circuit of claim 11, wherein the feedback means comprises:

means for comparing a feedback signal from the differential output means with a predetermined reference signal to generate a comparison signal, wherein the comparison signal controls the second and third current source means to control an output level of the differential amplifier means; and first and second resistive means in communication with the differential output means and an input of the comparator means.

13. The electrical circuit of claim 11, wherein the differential amplifier means further comprises:

fourth and fifth current source means in communication with the input and start-up means; and sixth and seventh current source means in communication with the differential output means and the output circuit means.

14. The electrical circuit of claim 10, wherein the start-up circuit means ceases generation of the start-up signal when the operation of the differential amplifier means reaches a steady-state.

15. The electrical circuit of claim 10, wherein the electrical circuit is compliant with a standard selected from the group consisting of 802.11, 802.11a, 802.11b, 802.11g and 802.11i.

16. An electrical circuit, comprising:
an amplifier, comprising:
an input circuit in communication with an input of the amplifier;
a start-up circuit in communication with the input circuit, wherein the start-up circuit is configured to generate a start-up signal to enable subsequent operation of the amplifier and the start-up circuit turns off when an output of the amplifier reaches a threshold voltage; and
an output circuit in communication with the output of the amplifier and in communication with the input circuit and the start-up circuit, wherein the start-up circuit comprises:
a first start-up transistor; and
a second start-up transistor, wherein base electrodes of the first and second start-up transistors are in communication with a bias input, wherein emitter electrodes of the first and second start-up transistors are in communication with each other and with a first current source, and wherein collector electrodes of the first and second start-up transistors are in communication with collector electrodes of first and second input transistors, respectively.

17. An electrical circuit, comprising:
an amplifier, comprising:
an input circuit in communication with an input of the amplifier;
a start-up circuit in communication with the input circuit, wherein the start-up circuit is configured to generate a start-up signal to enable subsequent operation of the amplifier and the start-up circuit turns off when an output of the amplifier reaches a threshold voltage; and
an output circuit in communication with the output of the amplifier and in communication with the input circuit and the start-up circuit, wherein the output circuit comprises:
a first output transistor;
a second output transistor;
a first impedance circuit; and
a second impedance circuit, wherein base electrodes of the first and second output transistors are in communication with the first and second impedance circuits, respectively, and collector electrodes of first and second input transistors, respectively, wherein emitter electrodes of the first and second output transistors are in communication with each other and with a first current source, wherein collector electrodes of the first and second output transistors are in communication with the first and second impedance circuits, respectively, and the output.

18. The electrical circuit of claim 17, wherein each of the first and second impedance circuits comprises a capacitor and a resistor in series.

19. An electrical circuit, comprising:
an amplifier, comprising:
an input circuit in communication with an input of the amplifier;
a start-up circuit in communication with the input circuit, wherein the start-up circuit is configured to generate a start-up signal to enable subsequent operation of the amplifier and the start-up circuit turns off when an output of the amplifier reaches a threshold voltage;
an output circuit in communication with the output of the amplifier and in communication with the input circuit and the start-up circuit; and
a common-mode feedback circuit in communication with the output and second and third current sources, wherein the second and third current sources are in communication with the input and start-up circuits, wherein the common-mode feedback circuit comprises:
a comparator for comparing a feedback signal from the output with a predetermined reference signal to generate a comparison signal, wherein the comparison signal controls the second and third current sources to control an output level of the amplifier; and
first and second resistors in communication with the output and an input of the comparator.

20. An electrical circuit, comprising:
an amplifier means, comprising:
an input circuit means for receiving an input signal, wherein the input circuit means is in communication with an input means of the amplifier means;
a start-up circuit means for generating a start-up signal to enable subsequent operation of the amplifier means, wherein the start-up circuit means is in communication with the input circuit means and the start-up circuit turns off when an output means of the amplifier means reaches a threshold voltage; and
an output circuit means for outputting an output signal, wherein the output circuit means is in communication with the output means of the amplifier means and in communication with the input circuit means and the start-up circuit means, wherein the start-up circuit means comprises:
first and second start-up amplifier means, wherein each of the first and second start-up amplifier means includes first, second and third electrode means, wherein the first electrode means of the first and second start-up amplifier means are in communication with a bias input means, wherein the second electrode means of the first and second start-up amplifier means are in communication with each other and with a first current source means, and wherein the third electrode means of the first and second start-up amplifier means are in communication with third electrode means of first and second input amplifier means, respectively.

21. An electrical circuit, comprising:
an amplifier means, comprising:
an input circuit means for receiving an input signal, wherein the input circuit means is in communication with an input means of the amplifier means;
a start-up circuit means for generating a start-up signal to enable subsequent operation of the amplifier means, wherein the start-up circuit means is in communication with the input circuit means and the start-up circuit turns off when an output means of the amplifier means reaches a threshold voltage; and
an output circuit means for outputting an output signal, wherein the output circuit means is in communication with the output means of the amplifier means and in communication with the input circuit means and the start-up circuit means, wherein the output circuit means comprises:
first and second output amplifier means, wherein each of the first and second output amplifier means includes first, second and third electrode means; and
first and second impedance means, wherein the first electrode means of the first and second output amplifier means are in communication with the first and second impedance means, respectively, and third electrode means of first and second input amplifier means, respectively, wherein the second electrode means of the first and second output amplifier means are in communication with each other and with a first current source means, and wherein the third electrode means of the first and second output amplifier means are in communication with the first and second impedance means, respectively, and the output means.

22. An electrical circuit, comprising:
an amplifier means, comprising:
an input circuit means for receiving an input signal, wherein the input circuit means is in communication with an input means of the amplifier means;
a start-up circuit means for generating a start-up signal to enable subsequent operation of the amplifier means, wherein the start-up circuit means is in communication with the input circuit means and the start-up circuit turns off when an output means of the amplifier means reaches a threshold voltage;
an output circuit means for outputting an output signal, wherein the output circuit means is in communication with the output means of the amplifier means and in communication with the input circuit means and the start-up circuit means; and
feedback means in communication with the output means and second and third current source means, wherein the second and third current source means are in communication with the input and start-up circuit means.

23. The electrical circuit of claim 22, wherein the feedback means comprises:
means for comparing a feedback signal from the output means with a predetermined reference signal to generate a comparison signal, wherein the comparison signal controls the second and third current source means to control an output level of the amplifier means; and
first and second resistive means in communication with the output means and an input of the comparator means.

24. The electrical circuit of claim 22, wherein the amplifier means further comprises:
fourth and fifth current source means in communication with the input and start-up circuit means; and
sixth and seventh current source means in communication with the output means and the output circuit means.

* * * * *

UNITED STATES PATENT AND TRADEMARK OFFICE
CERTIFICATE OF CORRECTION

PATENT NO. : 7,180,369 B1
APPLICATION NO. : 10/759173
DATED : February 20, 2007
INVENTOR(S) : Donghong Cui et al.

It is certified that error appears in the above-identified patent and that said Letters Patent is hereby corrected as shown below:

Column 5, Line 32: Delete "802.1$\mu$g" and insert --802.11g--
Column 9, Line 16: Delete "802.1g" and insert --802.11g--
Column 10, Line 1: Insert --to-- after "According"
Column 10, Line 44: Delete "the" (first occurrence) and insert --that--

Signed and Sealed this

Twenty-second Day of May, 2007

JON W. DUDAS
*Director of the United States Patent and Trademark Office*